United States Patent
Donarski (10) Patent No.: US 8,306,242 B2
(45) Date of Patent: Nov. 6, 2012

(54) HEYSER SPIRAL LOW FREQUENCY CORRECTION OF FIR FILTERS

(75) Inventor: Matthew A Donarski, Minneapolis, MN (US)

(73) Assignee: Robert Bosch GmbH, Stuttgart (DE)

( * ) Notice: Subject to any disclaimer, the term of this patent is extended or adjusted under 35 U.S.C. 154(b) by 197 days.

(21) Appl. No.: 12/825,866

(22) Filed: Jun. 29, 2010

(65) Prior Publication Data

US 2011/0317853 A1    Dec. 29, 2011

(51) Int. Cl.
*H04B 15/00* (2006.01)
*H04R 1/40* (2006.01)
*H03G 5/00* (2006.01)

(52) U.S. Cl. ......... 381/94.9; 381/94.2; 381/97; 381/103

(58) Field of Classification Search .................. 381/374, 381/74, 370, 379, 103, 94.9, 94.1, 94.2, 97
See application file for complete search history.

(56) References Cited

U.S. PATENT DOCUMENTS

| | | | |
|---|---|---|---|
| 4,937,874 A | 6/1990 | Pittman et al. | |
| 5,272,656 A | 12/1993 | Genereux | |
| 5,696,708 A | 12/1997 | Leung | |
| 5,772,603 A | 6/1998 | Ohlsson et al. | |
| 5,946,154 A | 8/1999 | Ino | |
| 5,956,411 A * | 9/1999 | Edgar | 381/97 |
| 6,324,487 B1 | 11/2001 | Qian et al. | |
| 2008/0279318 A1* | 11/2008 | Bharitkar et al. | 375/350 |

* cited by examiner

*Primary Examiner* — Vivian Chin
*Assistant Examiner* — Douglas Suthers
(74) *Attorney, Agent, or Firm* — Taft, Stettinius & Hollister LLP; Keith Swedo (57) ABSTRACT

A method of operating a loudspeaker includes providing a digital audio signal and identifying a target transfer function to be applied to the signal. At least one coefficient of an FIR filter is generated. The generating includes performing Heyser spiral curve fitting, and fitting a three-dimensional curve based on a magnitude and phase of a target transfer function. The digital audio signal is filtered through the FIR filter. The filtered signal is inputted into the loudspeaker.

18 Claims, 11 Drawing Sheets

HEYSER SPIRAL LOW FREQUENCY CORRECTION OF FIR FILTERS

COPYRIGHT NOTICE

Portions of this document are subject to copyright protection. The copyright owner does not object to facsimile reproduction of the patent document as it is made available by the U.S. Patent and Trademark Office. However, the copyright owner reserves all copyrights in the software described herein and shown in the text and drawings. The following notice applies to the software described and illustrated herein: Copyright © 2010, Robert Bosch GmbH, All Rights Reserved.

BACKGROUND OF THE INVENTION

1. Field of the Invention

The present invention relates to finite impulse response (FIR) filters and, more particularly, to FIR filters as they are applied to audio loudspeakers or other devices having a frequency response.

2. Description of the Related Art

An FIR type of digital filter has a finite impulse response in that it approaches zero in a finite number of sample intervals. In contrast, an infinite impulse response (IIR) filter has internal feedback and may continue to respond indefinitely. FIR filters have several advantages over IIR filters, including being inherently stable, requiring no feedback, and being capable of being linear or complex phase.

A basic form of an FIR filter may be provided by the following difference polynomial equation which defines how the input signal x[n] is related to the output signal y[n]:

$$y[n] = b_0 x[n] + b_1 x[n-1] + \ldots + b_N x[n-N]$$

wherein $b_i$ are the filter coefficients. N is known as the "filter order." An Nth-order filter has (N+1) terms on the right-hand side.

Another possible approach to defining the order of a polynomial is that the order is the highest order power in the polynomial, or alternatively, the polynomial's polynomial degree. For example, the polynomial $P(x) = a_n x^n + \ldots + a_2 x^2 + a_1 x + a_0$ is of order n, wherein n is greater than two (two being the highest other power of x that is shown in the equation).

FIR filters, because of their finite length, may exhibit problems correcting magnitude and phase at low frequencies, such as below 300 Hz. The frequency at which the FIR filter loses resolution is a function of the DSP sampling rate and the FIR filter order. This is related to the time-frequency uncertainty principle $\Delta t \cdot \Delta f = 1$ where $\Delta t$ is an uncertainty in time and $\Delta f$ is an uncertainty in frequency. Consequently, loudspeaker-room acoustic equalization may be difficult to achieve with FIR filters at low frequencies.

What is neither disclosed nor suggested in the art is a loudspeaker system that overcomes the problems and limitations described above. More particularly, what is neither disclosed nor suggested is a loudspeaker system employing an FIR filter that performs well at low frequency.

SUMMARY OF THE INVENTION

The invention may be directed to dealing with low frequency limitation issues of FIR filters as applied to loudspeaker digital signal processing (DSP). More particularly, the invention may be directed to correcting magnitude and phase of FIR filters at low frequencies via Heyser Spiral curve fitting in the FIR coefficient generation process. A three-dimensional curve fit may be performed based on the desired magnitude and phase of a target transfer function. For low enough order polynomials, the fit can be used to obtain a low frequency response that approximately hits the average target magnitude and phase response below the low frequency limit of the FIR filter.

The invention comprises, in one form thereof, a method of operating a loudspeaker including providing a digital audio signal and identifying a target transfer function to be applied to the signal. At least one coefficient of an FIR filter is generated. The generating includes performing Heyser spiral curve fitting, and fitting a three-dimensional curve based on a magnitude and phase of a target transfer function. The digital audio signal is filtered through the FIR filter. The filtered signal is inputted into the loudspeaker.

The invention comprises, in another form thereof, a method of operating a loudspeaker, including providing a digital audio signal. A frequency is selected below which an FIR filter is to be corrected. Magnitude and phase of the filter frequency response are fitted by separate low-order polynomial functions below this frequency and converge to a calculated transfer function above this frequency. The digital audio signal is filtered through the FIR filter. The filtered signal is inputted into the loudspeaker.

The invention comprises, in yet another form thereof, a loudspeaker arrangement including a loudspeaker having an input, and a digital FIR filter having an input and an output. The input of the filter receives an audio signal. The output is coupled to the input of the loudspeaker. Coefficients of the filter are created using the Heyser spiral correction method to correct or improve low frequency response of the filter. The frequency response of the FIR filter is defined by a multi-dimensional polynomial at low frequencies and is calculated by conjugation to a target at high frequencies.

BRIEF DESCRIPTION OF THE DRAWINGS

The above mentioned and other features and objects of this invention, and the manner of attaining them, will become more apparent and the invention itself will be better understood by reference to the following description of embodiments of the invention taken in conjunction with the accompanying drawings, wherein.

Corresponding reference characters indicate corresponding parts throughout the several views. Although the exemplification set out herein illustrates embodiments of the invention, in several forms, the embodiments disclosed below are not intended to be exhaustive or to be construed as limiting the scope of the invention to the precise forms disclosed.

DESCRIPTION OF THE PRESENT INVENTION

Figure 1:
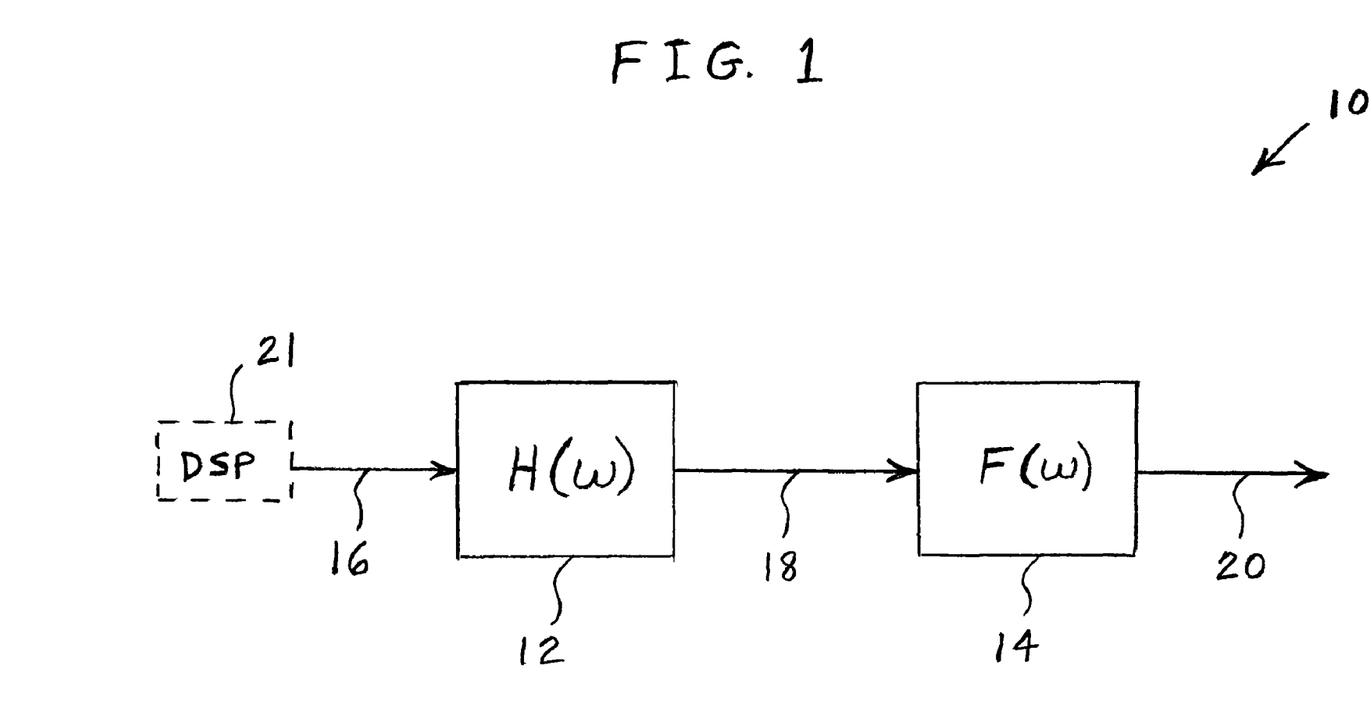
FIG. 1 is a block diagram of one embodiment of a loudspeaker arrangement of the present invention.

Referring now to the drawings, and particularly to FIG. 1, there is shown a block diagram of one embodiment of a loudspeaker arrangement 10 of the present invention. Arrangement 10 may include an FIR filter 12 having a frequency response $H(\omega)$, where $\omega$ is the angular frequency in radians, and a loudspeaker 14 having a frequency response $F(\omega)$. FIR filter 12 receives an input signal 16, and transmits a filtered version 18 of input signal 16 to loudspeaker 14. Loudspeaker 14, in turn, emits sound waves 20 into the air, and sound waves 20 may be heard by a listener.

A primary metric in determining the performance of a loudspeaker is its frequency response $F(\omega)$. This frequency response is a complex function that contains both magnitude and phase data, but the response is typically looked at only in terms of magnitude on a logarithmic scale (dB). One alternate method of looking at frequency response data is a three-dimensional visualization known as a Heyser Spiral. This visualization method plots the real component of the frequency response on the x-axis, the imaginary component of the frequency response on the y-axis, and frequency on the z-axis. A Heyser Spiral Correction method of the present invention for generating FIR filters may exploit this Heyser Spiral visualization method for applying low frequency correction to FIR filters.

Figure 2:
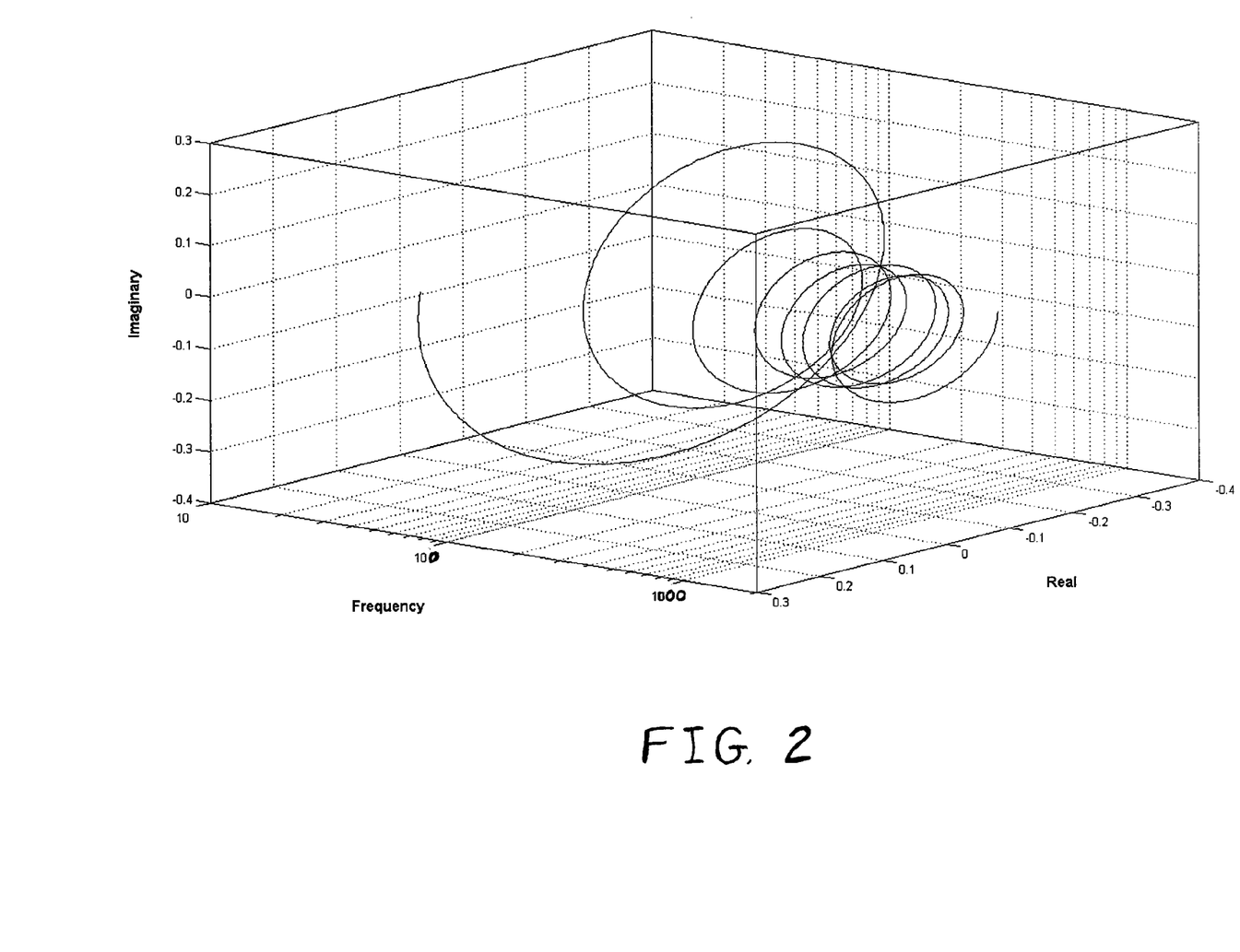
FIG. 2 is an example three-dimensional plot of a Heyser Spiral of a filter frequency response.

In FIG. 2 a spiraling plot of a loudspeaker frequency response is displayed showing the real and imaginary components of $F(\omega)$ plotted as a function of frequency $\omega$. The phase response of the loudspeaker may be extracted by simply plotting $Arg(F(\omega))$ versus $\omega$. Likewise, the magnitude response may be extracted from the modulus of $F(\omega)$.

One typical method of generating FIR filter coefficients for a loudspeaker response is to simply calculate the complex conjugate of the loudspeaker's frequency response function, $H(\omega)$.

$$H(\omega) = \frac{1}{F(\omega)} \quad (1)$$

Then, taking the inverse Fast Fourier Transform (FFT) of $H(\omega)$, truncating this function and applying a Hamming window yields an FIR filter coefficient set of length L, as shown by Equation (2):

$$FIR[n] = w[n] \cdot \begin{cases} f[n] = FFT^{-1}(H(\omega)), & 1 \leq n \leq L \\ 0, & \text{otherwise} \end{cases} \quad (2)$$

where n denotes the sample number and w[n] is the hamming window function $$w[n] = 0.54 - 0.46\cos\left(\frac{2\pi n}{L-1}\right) \quad (3)$$

Figure 3:
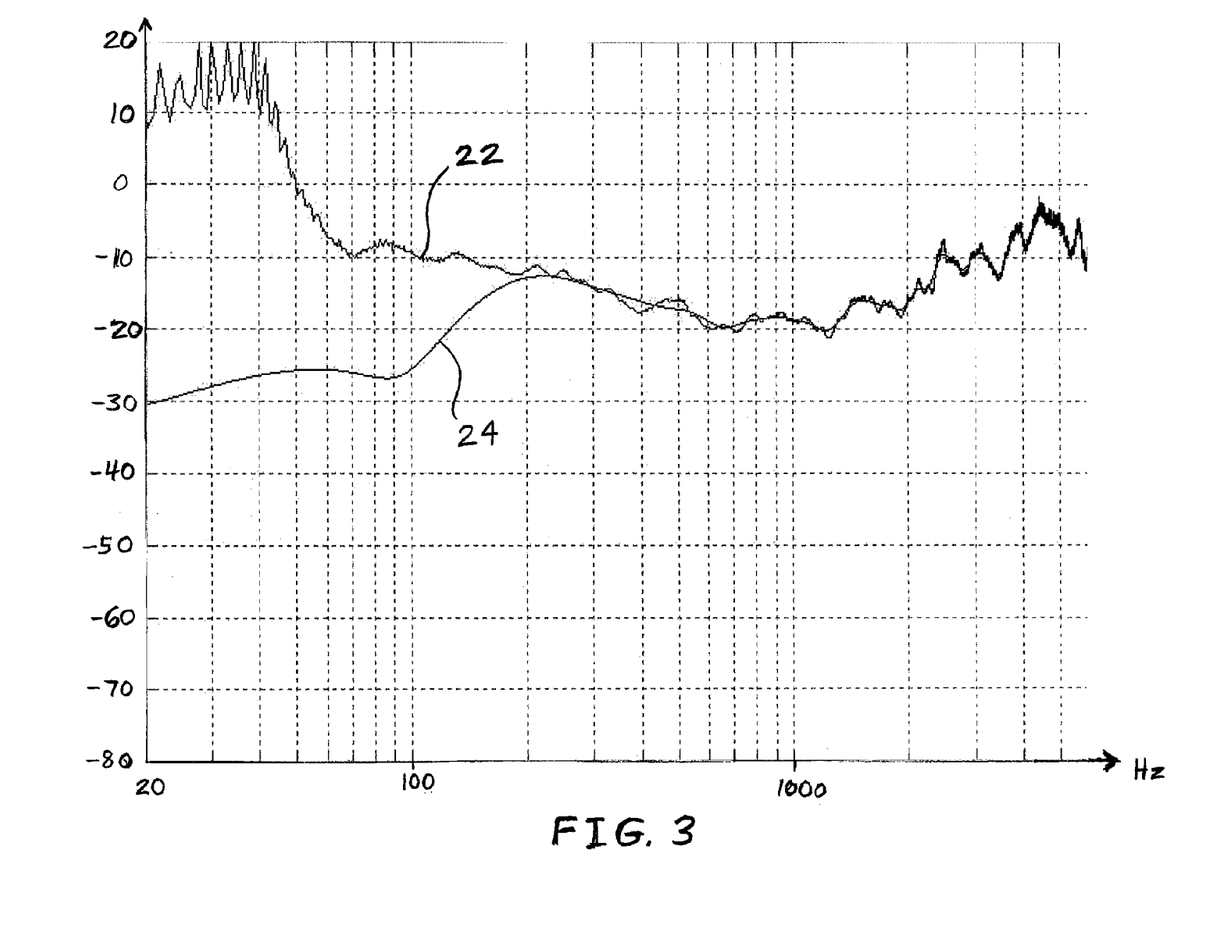
FIG. 3 is an example plot of both a target transfer function and an actual transfer function for a loudspeaker FIR filter as a function of frequency.

This method produces errors in the magnitude and phase response of the FIR filter at low frequencies because of the time-frequency uncertainty principle. FIR filters calculated from a conjugation of frequency response of a loudspeaker with respect to some target transfer function may deviate from the desired response at low frequencies. Illustrating this, FIG. 3 is a plot of a target transfer function 22 for a loudspeaker FIR filter based on a conjugation of the loudspeaker's frequency response, and the actual achieved result 24 based on conjugation of the loudspeaker's frequency response. In the neighborhood of 100 Hz and below, there is a deviation between target transfer function 22 and the actual achieved result 24.

Figure 4:
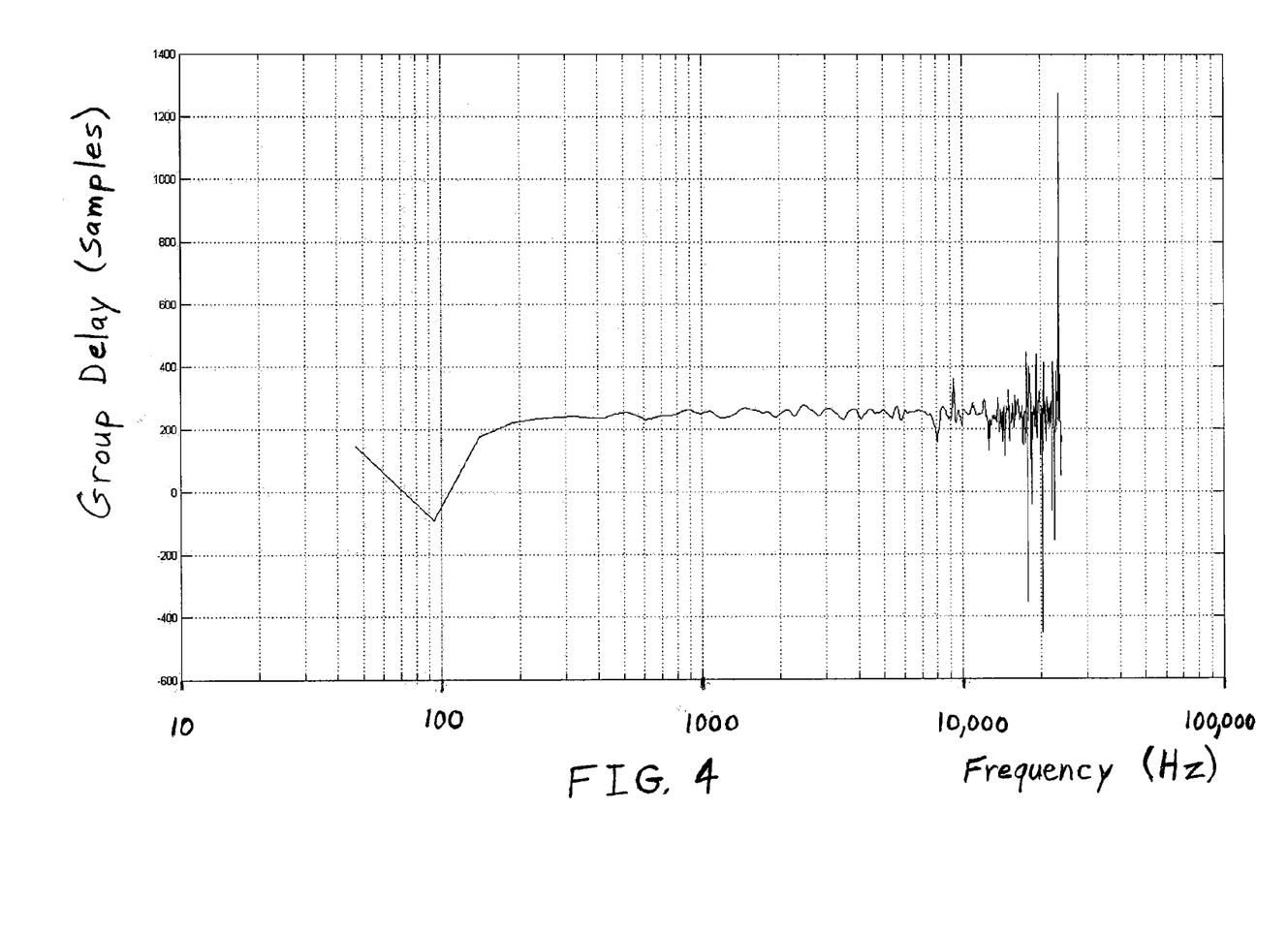
FIG. 4 is an example plot of a group delay through a filter calculated from a direct conjugation of a loudspeaker's frequency response.

An example plot of a group delay through a filter calculated from a direct conjugation of a loudspeaker's frequency response is shown in FIG. 4. An approximately constant value of the group delay is illustrated, with the exception of low frequencies in the neighborhood of 100 Hz. The response deviation near 100 Hz causes a phase distortion substantial enough to produce a negative group delay through the filter.

Figure 5:
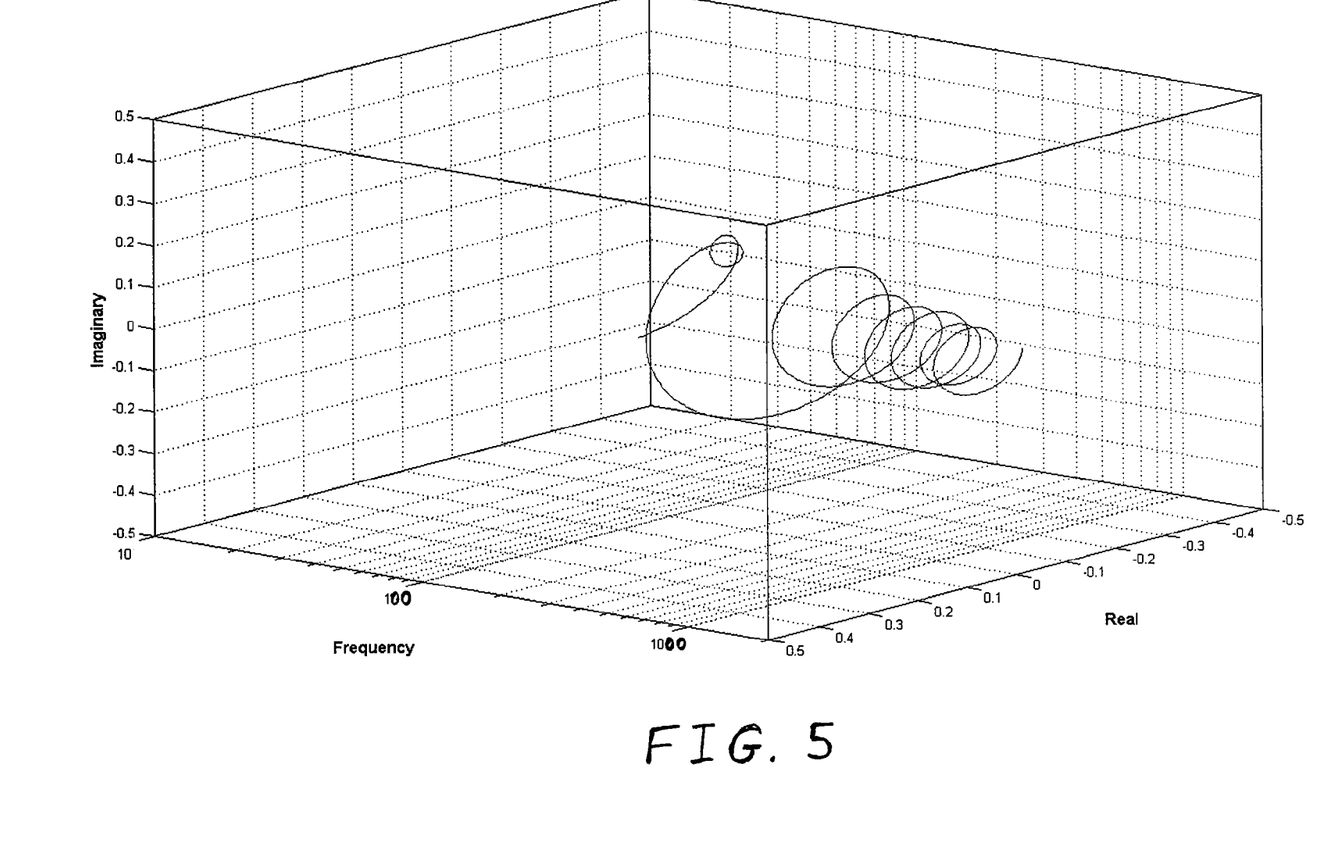
FIG. 5 is an example plot of a Heyser spiral of an FIR filter calculated by frequency response conjugation.

Because an FIR filter is, by definition, of finite length, the frequency resolution of such a filter is restricted. Frequency resolution limitations cause errors in the FIR filter coefficients when calculated as described above. These errors manifest themselves as deviations from the target frequency and phase response. The error of the filter may be seen in its Heyser Spiral, where a magnitude/phase error made be apparent as a loop at low frequency. Frequency and phase response errors in the filter manifest themselves as small "loops" in the Heyser spiral, as shown in FIG. 5. More particular, in FIG. 5, there is a rapid phase transition around 100 Hz that produces a little "loop".

Figure 6:
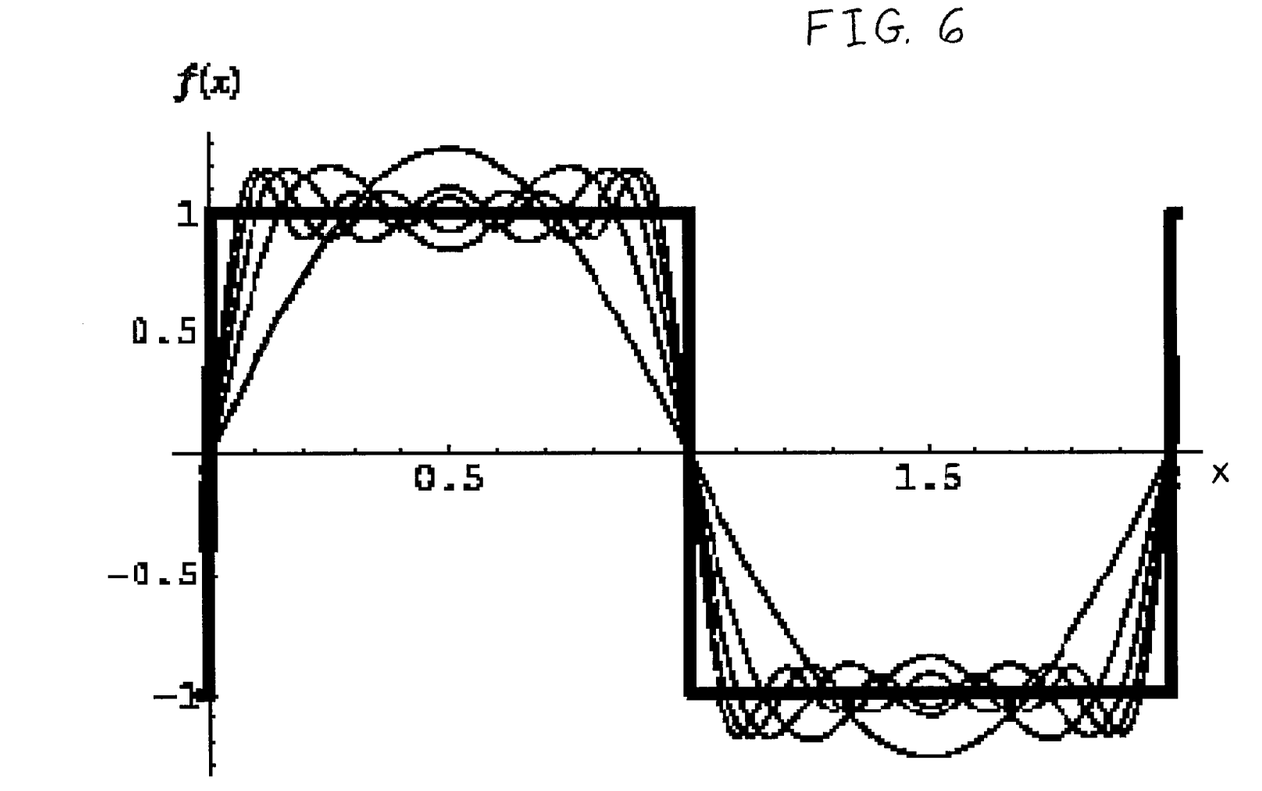
FIG. 6 is an illustration of Gibbs phenomenon for a series of sinusoids summed to construct a square wave.

A qualitative understanding of the Heyser spiral correction method of the invention may be gained from an analogy to Gibbs phenomenon, which is illustrated in FIG. 6. Gibbs phenomenon may be thought of as an error for a time domain curve that occurs when constructing such a curve out of a series of sinusoids. This error is generally associated with curve discontinuities and is generally inversely related to the number of sinusoidal components used to generate a curve. The Heyser spiral correction method of the invention may include reducing the low frequency error by causing the target frequency response curve to be sufficiently smooth at low frequencies.

Figure 7:
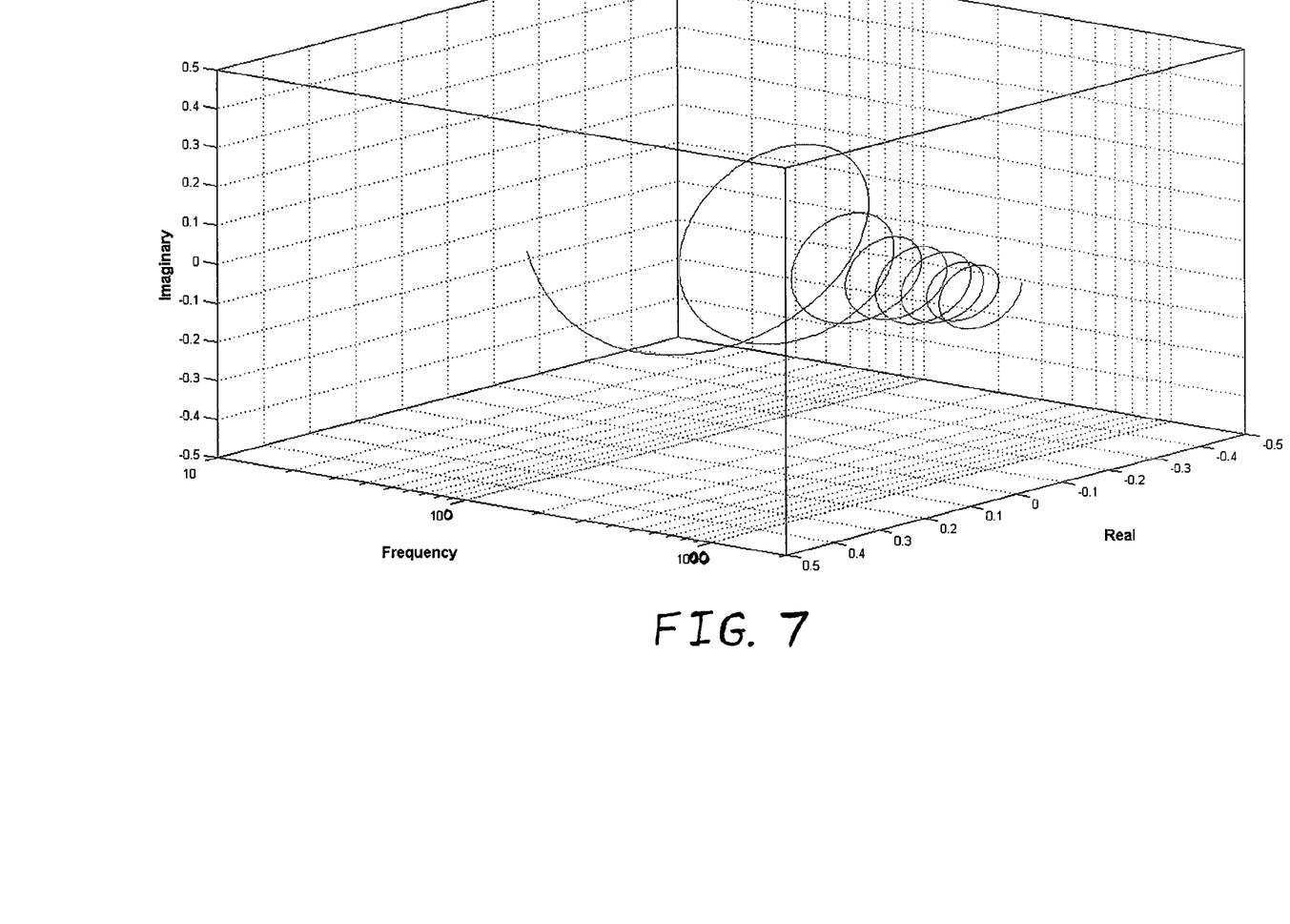
FIG. 7 is an example plot of a Heyser spiral of the same filter as in FIG. 5 with a low frequency Heyser spiral correction method of the invention applied thereto.

The Heyser Spiral Correction method of the invention may repair the Heyser Spiral of the filter by fitting low order polynomials to the frequency responses and/or phase responses of the target filter at midrange frequencies. The method may work particularly well with a low frequency magnitude specified by the user. The low order polynomial fit may generate transitions in the Heyser Spiral that are more gradual, as illustrated in FIG. 7. Thus, some of the low frequency limitations of the FIR filter may be overcome.

A Heyser spiral correction may be implemented by selecting a low frequency limit, $\omega_L$, based on the desired length of the FIR filter, L. A new target curve may then be constructed such that for $\omega \leq \omega_L$, $H(\omega)$ becomes $H_L(\omega)$ where $H_L(\omega)$ is a polynomial of low order in logarithmic magnitude space (dB) and of low order in unwrapped phase space. This may produce a corrected FIR filter coefficient set that is well behaved in both magnitude and phase at low frequencies, as shown in FIG. 7. Separate polynomials may be used to do the magnitude and phase fitting, and these polynomials may be of different order. The frequency response of the filter above $\omega_L$ is not defined by a polynomial, rather it may be produced by a calculation based on a target transfer function and the frequency response of the loudspeaker. Thus, the frequency response of the FIR filter may be defined by a multi-dimensional polynomial at low frequencies (e.g., below a selected cutoff frequency), and may be calculated by conjugation to a target at high frequencies (e.g., above a selected cutoff frequency).

The application of the method of the invention is not limited to acoustics or loudspeaker DSP. Rather, the method may be applied more generally to a generic device with a frequency response $F(\omega)$. The desired frequency response of the device may not be unity for all frequencies, as indicated by equation (1) above. Thus, the desired frequency response of the device may be generalized as an arbitrary function, $A(\omega)$. Hence, equation (1) becomes $$H(\omega) = \frac{A(\omega)}{F(\omega)} \quad (4)$$

A frequency $\omega_L$ may then be selected based on the length of the FIR filter and the behavior of $H(\omega)$. The application of a polynomial fitting function for a) $\omega \leq \omega_L$ may call for $H(\omega)$ to be sufficiently smooth in the vicinity of $\omega_L$ so that the polynomial low frequency function mates well with $H(\omega)$. That is, the combination of the polynomial low frequency function and $H(\omega)$ may be a continuous function in the vicinity of $\omega_L$. Once $\omega_L$ is selected, the low order polynomial correction may be applied in magnitude space and phase space, so $H(\omega)$ becomes $\overline{H}(\omega)$ and $$\overline{H}(\omega) = \begin{cases} H_L(\omega), & \omega \leq \omega_L \\ H(\omega), & \text{otherwise} \end{cases} \quad (5)$$

where $$|H_L(\omega)| = 10^{\sum_{n=0}^{N} c_n \omega^n} \quad (6)$$

and $$\text{unwrap}(\arg(H_L(\omega))) = \sum_{k=0}^{K} b_k \omega^k \quad (7)$$

where $c_n$ and $b_k$ are the respective polynomial coefficients for the logarithmic magnitude and unwrapped phase functions. From $\overline{H}(\omega)$ a new set of FIR filter coefficients may be constructed. The FIR coefficients that have a corrected Heyser spiral, $FIR_{HS}$ may be calculated by $$FIR_{HS}[n] = w[n] \cdot \begin{cases} f[n] = FFT^{-1}(\overline{H}(\omega)), & 1 \leq n \leq L \\ 0, & \text{otherwise} \end{cases} \quad (8)$$

The parameters $\omega_L$, the fit coefficients, as well as the polynomial fitting orders, N and K can be placed into an optimization function which minimizes the error of the frequency response of $FIR_{HS}$ with respect to the target frequency response, $H(\omega)$.

The present invention has been described herein as applying to a FIR filter for loudspeaker DSP. However, it is to be understood that the method of the invention applies to the creation of any FIR filter that is created with the intention of doing frequency response correction at low frequencies.

Figure 8:
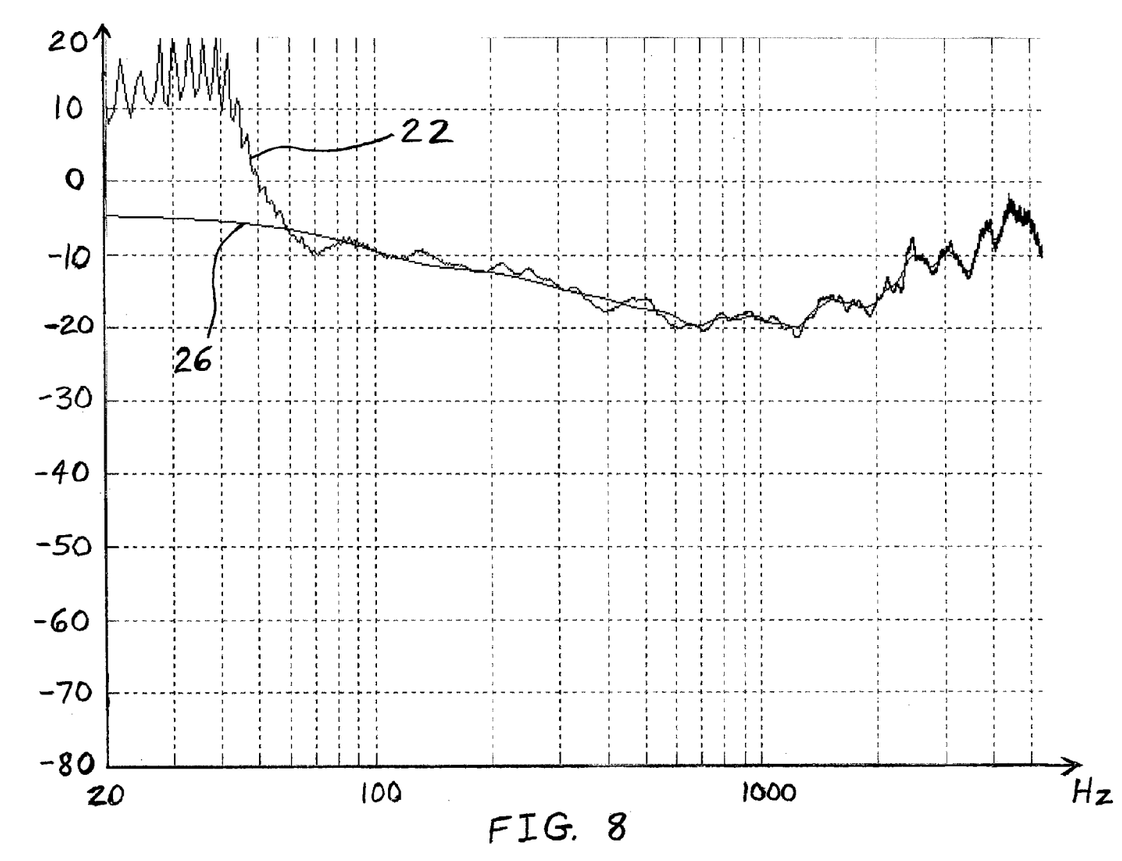
FIG. 8 is an example plot of both the target transfer function of FIG. 3 and an actual transfer function with Heyser spiral correction applied thereto for a loudspeaker FIR filter as a function of frequency.
Figure 9:
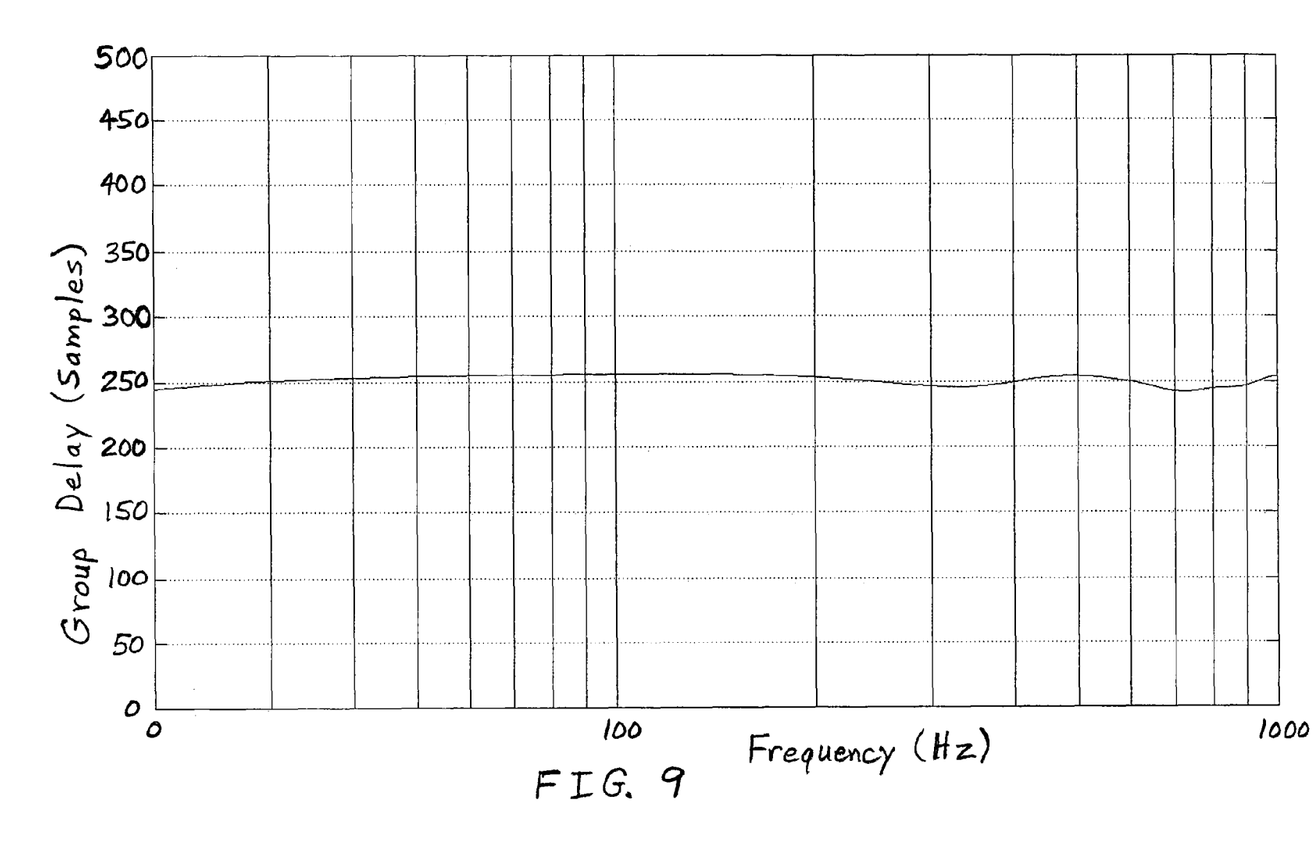
FIG. 9 is an example plot of a group delay through a filter having Heyser spiral correction applied thereto according to the invention.

FIG. 8 includes the same plot of a target transfer function 22 for a loudspeaker FIR filter as shown in FIG. 3. FIG. 8 also includes a plot of the actual achieved result 26, after Heyser spiral correction, based on conjugation of the loudspeaker's frequency response. In the neighborhood of 100 Hz and below, there is still a deviation between target transfer function 22 and the corrected actual achieved result 26, but the deviation is not as great as between target transfer function 22 and the actual achieved result 24 shown in FIG. 3. An example plot of a group delay through a Heyser spiral corrected filter calculated from a direct conjugation of a loudspeaker's frequency response is shown in FIG. 9.

Figure 10:
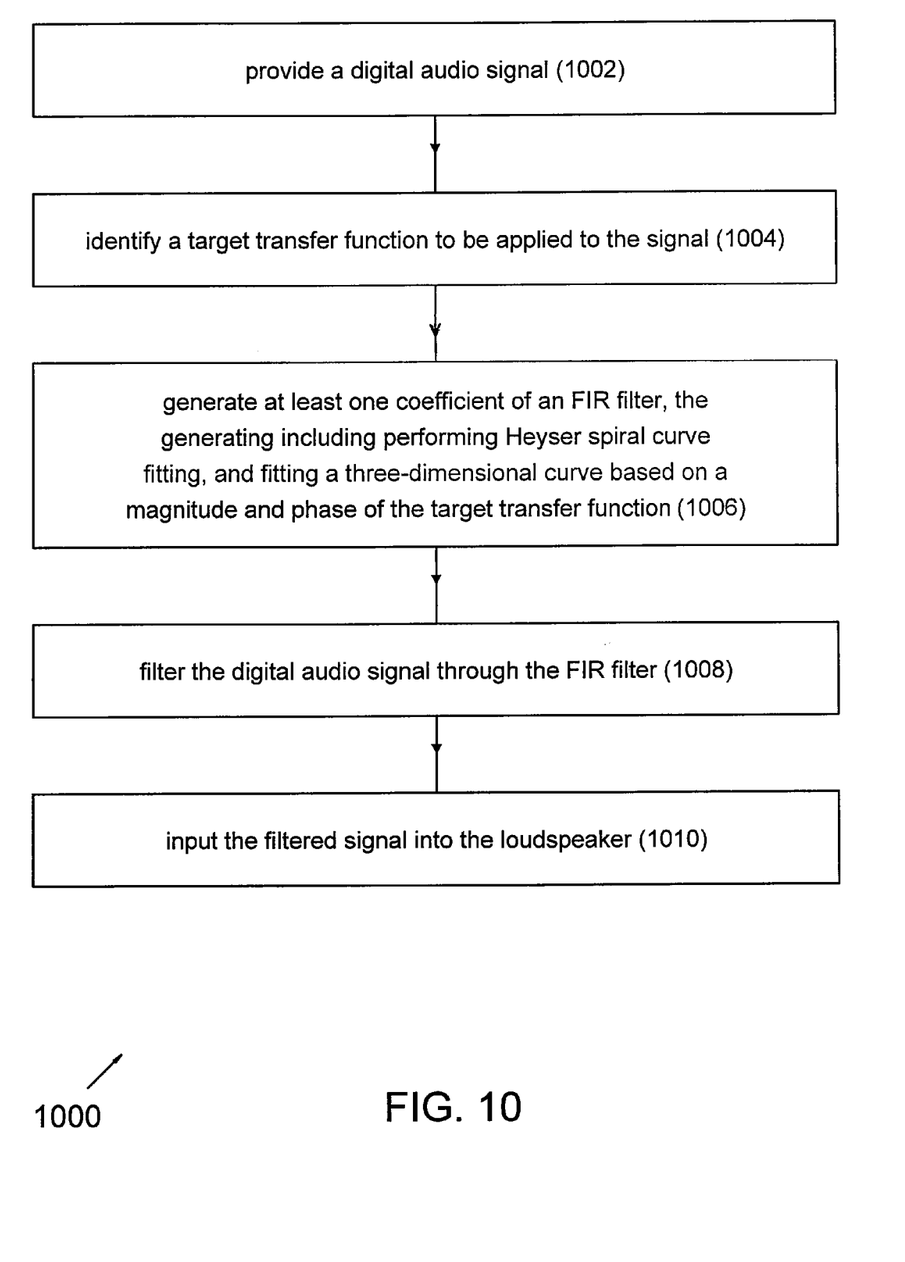
FIG. 10 is a flow chart of one embodiment of a method of the present invention for operating a loudspeaker.

In FIG. 10, there is shown one embodiment of a method 1000 of the present invention for operating a loudspeaker. In a first step 1002, a digital audio signal is provided. For example, a digital audio input signal 16 may be produced by an optional digital signal processor 21 (FIG. 1) based on an analog signal from a microphone or broadcast radio signal.

In a next step 1004, a target transfer function to be applied to the signal is identified. Preparation for determining a desired loudspeaker transfer function may include acquiring information regarding both local acoustic properties at the listening position within a three-dimensional sound field space and the acoustic power in the three-dimensional sound field. The target transfer function may be identified based upon this acquired information by use of techniques known in the art.

Next, in step 1006, at least one coefficient of an FIR filter is generated. The generating includes performing Heyser spiral curve fitting, and fitting a three-dimensional curve based on a magnitude and phase of the target transfer function. The Heyser spiral curve fitting may generally include repairing the "small loop" artifact of a Heyser spiral (e.g., see FIG. 5) at low frequency by fitting low order polynomials to the frequency responses and/or phase responses of the target filter at midrange frequencies. The low order polynomials may be plotted as a new target curve at lower frequencies wherein the curve has smooth transitions in both magnitude and phase.

In step 1008, the digital audio signal is filtered through the FIR filter. For example, as shown in FIG. 1, digital audio input signal 16 is fed through FIR filter 12 and a filtered version 18 of digital audio input signal 16 is output from filter 12.

In a final step 1010, the filtered signal is inputted into the loudspeaker. For example, as also shown in FIG. 1, filtered version 18 of digital audio input signal 16 that is output from filter 12 is fed into loudspeaker 14.

Figure 11:
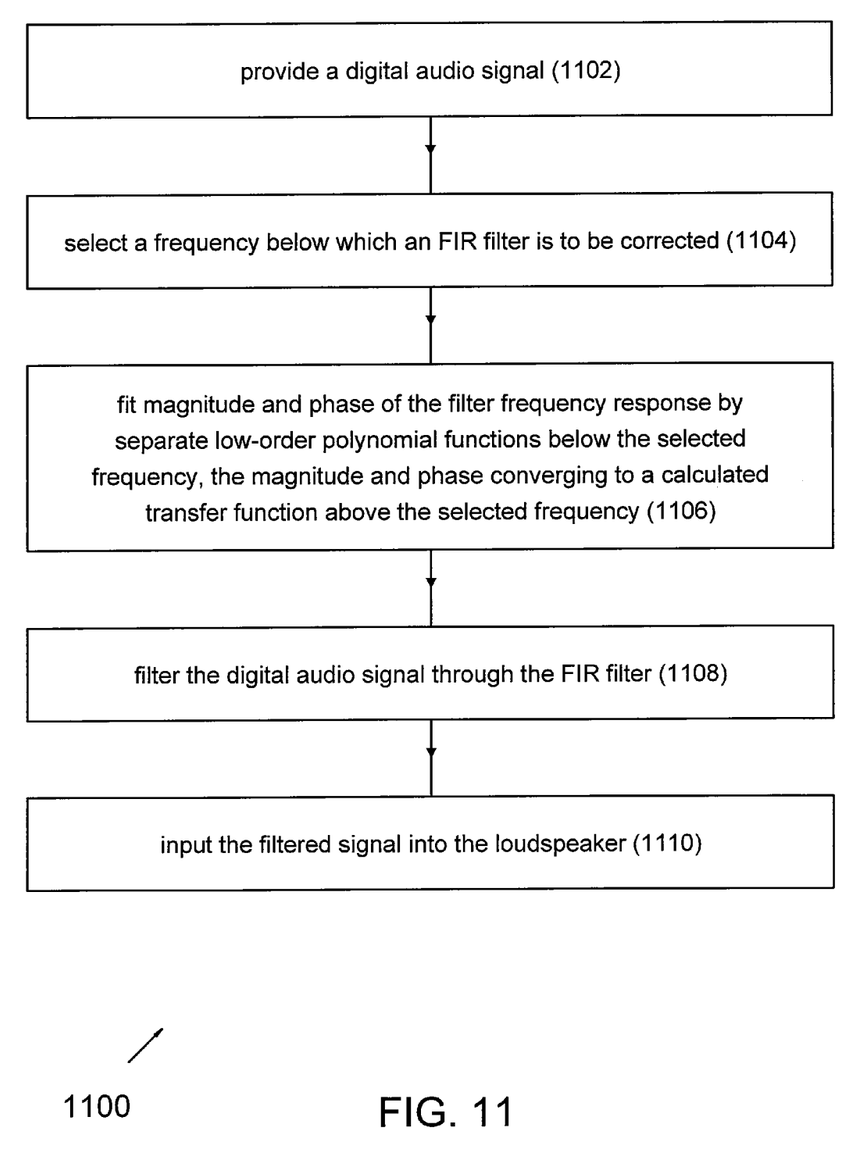
FIG. 11 is a flow chart of another embodiment of a method of the present invention for operating a loudspeaker.

Another embodiment of a method 1100 of the present invention for operating a loudspeaker is illustrated in FIG. 11. In a first step 1102, a digital audio signal is provided. For example, a digital audio input signal 16 may be produced by a digital signal processor (not shown) based on an analog signal from a microphone or broadcast radio signal.

In a next step 1104, a frequency below which an FIR filter is to be corrected is selected. That is, a cutoff frequency at which there is a substantial difference between a target transfer function value and an actual transfer function value for a loudspeaker FIR filter may be determined. For example, a highest frequency at which the difference between the target transfer function value and the actual transfer function value exceeds a threshold difference may be determined. More generally, a frequency may be ascertained at an upper end of a range of frequencies in which the difference between the target transfer function value and the actual transfer function value for the FIR filter exceeds the threshold value.

As shown in the example plot of FIG. 3, in the neighborhood of 100 Hz and below, there is a substantial deviation between target transfer function 22 and the actual achieved result 24. Thus, 100 Hz may be selected as a delineation frequency below which FIR filter 12 is to be corrected. This selected low frequency limit may be designated $\omega_L$, and may be based on the desired length of the FIR filter, L.

The frequency 100 Hz may be chosen somewhat arbitrarily as the approximate frequency in FIG. 3 at which there is a substantial deviation between target transfer function 22 and the actual achieved result 24. However, it is to be understood that it is within the scope of the invention for this delineation frequency that marks the transition between the lower order polynomial of lower frequencies and the higher order polynomial or higher frequencies to be chosen among a wide range of frequencies. For example, with continuing reference to FIG. 3, the delineation frequency may be chosen as any frequency between 20 Hz and 1000 Hz. As a specific example, the frequency 200 Hz may be chosen as being the frequency at which target transfer function 22 and the actual achieved result 24 begin to deviate. So long as the transition between the lower order polynomial and the higher order polynomial is smooth enough in the region of the cutoff frequency and/or long enough in terms of frequency span, the higher order polynomial artifact in the form of the small loop in FIG. 5 may still be advantageously smoothed out, even if there is a relatively large difference between the delineation frequency and the frequency range in which the small loop artifact occurs.

In step 1106, magnitude and phase of the filter's frequency response are fitted by separate low-order polynomial functions below the selected frequency. The magnitude and phase converge to a calculated transfer function above the selected frequency. In a specific example, for frequencies $\omega$ below the low frequency limit $\omega_L$, i.e., for $\omega \leq \omega_L$, the magnitude and phase of a frequency response $H(\omega)$ of filter 12 are fitted by separate low-order polynomial functions below the selected frequency. For these frequencies $\omega$ below the low frequency limit $\omega_L$, the magnitude and phase of a frequency response $H(\omega)$ of filter 12 may be defined by a polynomial of low order in logarithmic magnitude space (dB) and of low order in unwrapped phase space.

In step 1108, the digital audio signal is filtered through the FIR filter. For example, as shown in FIG. 1, digital audio input signal 16 is fed through FIR filter 12 and a filtered version 18 of digital audio input signal 16 is output from filter 12.

In a final step 1110, the filtered signal is input into the loudspeaker. For example, as also shown in FIG. 1, filtered version 18 of digital audio input signal 16 that is output from filter 12 is fed into loudspeaker 14.

While this invention has been described as having an exemplary design, the present invention may be further modified within the spirit and scope of this disclosure. This application is therefore intended to cover any variations, uses, or adaptations of the invention using its general principles.

What is claimed is:

1. A method of operating a loudspeaker, the method including:
   providing a digital audio signal;
   identifying a target transfer function to be applied to the signal;
   generating at least one coefficient of an FIR filter, the generating including performing Heyser spiral curve fitting, and fitting a three-dimensional curve based on a magnitude and phase of the target transfer function;
   filtering the digital audio signal through the FIR filter; and
   inputting the filtered signal into the loudspeaker.

2. The method of claim 1, wherein the generating step includes:
   selecting a cutoff frequency below which the FIR filter is to be corrected; and
   fitting magnitude and phase of a frequency response of the filter by separate low-order polynomial functions below the selected cutoff frequency, the magnitude and phase of the frequency response of the filter converging to a calculated transfer function above the selected cutoff frequency.

3. The method of claim 2, wherein the filter is defined by a continuous function throughout a transition from below the cutoff frequency to above the cutoff frequency.

4. The method of claim 2, wherein the Heyser spiral curve fitting includes smoothing the target transfer function at frequencies below the cutoff frequency.

5. The method of claim 2, wherein the selecting step includes determining a frequency at which there is a difference between a target transfer function value and an actual transfer function value for the FIR filter that exceeds a threshold value.

6. The method of claim 5, wherein the determining step includes ascertaining a frequency at an upper end of a range of frequencies below the cutoff frequency in which the difference between the target transfer function value and the actual transfer function value for the FIR filter exceeds the threshold value.

7. The method of claim 1, wherein the identifying step includes acquiring information regarding:
   local acoustic properties at a listening position within a three-dimensional sound field; and
   a level of acoustic power within the three-dimensional sound field.

8. A method of operating a loudspeaker, the method including:
   providing a digital audio signal;
   selecting a frequency below which an FIR filter is to be corrected;
   fitting magnitude and phase of a frequency response of the filter by separate low-order polynomial functions below the selected frequency, the magnitude and phase of the frequency response of the filter converging to a calculated transfer function above the selected frequency;
   filtering the digital audio signal through the FIR filter;
   inputting the filtered signal into the loudspeaker; and
   identifying a target transfer function to be applied to the signal, the providing step including generating at least one coefficient of the filter, the generating including performing Heyser spiral curve fitting, and fitting a three-dimensional curve based on a magnitude and phase of a target transfer function.

9. The method of claim 8, wherein the generating step includes selecting a cutoff frequency below which the FIR filter is to be corrected, the filter being defined by a smooth transition between the first polynomial and the second polynomial in the region of the cutoff frequency.

10. The method of claim 9, wherein the Heyser spiral curve fitting includes smoothing the target transfer function at frequencies below the cutoff frequency.

11. The method of claim 8 wherein the identifying step includes acquiring information regarding:
   local acoustic properties at a listening position within a three-dimensional sound field; and
   a level of acoustic power within the three-dimensional sound field.

12. A method of operating a loudspeaker, the method including:
   providing a digital audio signal;

selecting a frequency below which an FIR filter is to be corrected, the selecting step including determining a frequency at which there is a difference between a target transfer function value and an actual transfer function value for the FIR filter that exceeds a threshold value;

fitting magnitude and phase of a frequency response of the filter by separate low-order polynomial functions below the selected frequency, the magnitude and phase of the frequency response of the filter converging to a calculated transfer function above the selected frequency;

filtering the digital audio signal through the FIR filter; and inputting the filtered signal into the loudspeaker.

13. The method of claim 12, wherein the determining step includes ascertaining a frequency at an upper end of a range of frequencies in which the difference between the target transfer function value and the actual transfer function value for the FIR filter exceeds the threshold value.

14. A loudspeaker arrangement comprising:
a loudspeaker having an input; and
a digital FIR filter having an input and an output, the input of the filter being configured to receive an audio signal, the output being coupled to the input of the loudspeaker, coefficients of the filter having been created using a Heyser spiral correction method to correct or improve low frequency response of the filter, the frequency response of the FIR filter being defined by a multi-dimensional polynomial at low frequencies and being calculated by conjugation to a target at high frequencies.

15. The arrangement of claim 14, wherein the filter is defined by a smooth transition between the low frequencies and the high frequencies.

16. The arrangement of claim 14, wherein the filter is defined by a continuous function throughout a transition between the low frequencies and the high frequencies.

17. The arrangement of claim 14, further comprising a digital signal processor connected to the input of the filter and configured to transmit the audio signal.

18. The arrangement of claim 14, wherein at least one said coefficient of the filter is calculated by $$FIR_{HS}[n] = w[n] \cdot \begin{cases} f[n] = FFT^{-1}(\overline{H}(\omega)), & 1 \le n \le L \\ 0, & \text{otherwise.} \end{cases}$$

wherein $FIR_{HS}[n]$ represents the FIR coefficients for sample numbers n, w[n] is the hamming window function $$w[n] = 0.54 - 0.46 \cos\left(\frac{2\pi n}{L-1}\right),$$

f[n] represents the inverse Fast Fourier Transform of the loudspeaker's frequency response function, $H(\omega)$, and L represents a length of the FIR filter.

* * * * *